(12) United States Patent
Lee et al.

(10) Patent No.: US 11,088,347 B2
(45) Date of Patent: Aug. 10, 2021

(54) LIGHT EMITTING DEVICE

(71) Applicant: Au Optronics Corporation, Hsinchu (TW)

(72) Inventors: Kent-Yi Lee, Hsinchu (TW); Wen-Pin Chen, Hsinchu (TW); Wen-Tai Chen, Tainan (TW); Kuo-Jui Chang, Hsinchu County (TW); Tsu-Wei Chen, Hsinchu (TW); Kuo-Kuang Chen, Hsinchu (TW); Shih-Hsing Hung, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 69 days.

(21) Appl. No.: 16/439,725

(22) Filed: Jun. 13, 2019

(65) Prior Publication Data

US 2019/0393445 A1  Dec. 26, 2019

Related U.S. Application Data

(60) Provisional application No. 62/688,635, filed on Jun. 22, 2018.

(30) Foreign Application Priority Data

Jan. 21, 2019  (TW) ................................ 108102272

(51) Int. Cl.
*H01L 51/52* (2006.01)
(52) U.S. Cl.
CPC .............................. *H01L 51/5253* (2013.01)

(58) Field of Classification Search
CPC ............. H01L 27/3246; H01L 27/3283; H01L 27/3295; H01L 51/5253; H01L 51/52; H01L 51/5256
See application file for complete search history.

(56) References Cited

U.S. PATENT DOCUMENTS

| | | | |
|---|---|---|---|
| 7,723,209 B2 | 5/2010 | Maruyama et al. | |
| 8,691,604 B2 | 4/2014 | Maruyama et al. | |

(Continued)

FOREIGN PATENT DOCUMENTS

| | | |
|---|---|---|
| CN | 100539190 | 9/2009 |
| CN | 105932037 | 9/2016 |

(Continued)

*Primary Examiner* — Jose R Diaz
(74) *Attorney, Agent, or Firm* — JCIPRNET

(57) ABSTRACT

A light emitting device including a base, a first electrode, a barrier structure layer, a light emitting layer and a second electrode is provided. The barrier structure layer includes a first barrier layer in contact with the first electrode, a second barrier layer and a third barrier layer. The first barrier layer, the second barrier layer and the third barrier layer stack sequentially.
The materials of the first barrier layer and the third barrier layer include a dielectric material. The material of the second barrier layer includes a metal material. A boundary between the third barrier layer and the second barrier layer keeps a vertical distance from the first electrode. The light emitting structure layer is disposed between the first electrode and the second electrode and surrounded by the barrier structure layer. The thickness of the light emitting structure layer is not greater than the vertical distance.

18 Claims, 5 Drawing Sheets

(56) References Cited

U.S. PATENT DOCUMENTS

| | | |
|---|---|---|
| 9,269,817 B2 | 2/2016 | Maruyama et al. |
| 10,038,012 B2 | 7/2018 | Maruyama et al. |
| 2005/0112341 A1* | 5/2005 | Ito ..................... H01L 27/3246 |
| | | 428/209 |
| 2011/0198598 A1 | 8/2011 | Kim et al. |
| 2014/0145172 A1 | 5/2014 | Yamada et al. |
| 2018/0286934 A1 | 10/2018 | Zhao |
| 2018/0342694 A1 | 11/2018 | Tang |

FOREIGN PATENT DOCUMENTS

| | | |
|---|---|---|
| CN | 106449726 | 2/2017 |
| CN | 106784375 | 5/2017 |
| CN | 106920828 | 7/2017 |
| CN | 107579099 | 1/2018 |
| CN | 107644928 | 1/2018 |
| WO | 2007023272 | 3/2007 |

\* cited by examiner

LIGHT EMITTING DEVICE

CROSS-REFERENCE TO RELATED APPLICATION

This application claims the priority benefits of U.S. provisional application Ser. No. 62/688,635, filed on Jun. 22, 2018, and Taiwan application serial no. 108102272, filed on Jan. 21, 2019. The entirety of each of the above-mentioned patent applications is hereby incorporated by reference herein and made a part of this specification.

TECHNICAL FIELD

The present invention is related to an electronic device, and particularly related to a light emitting device.

DESCRIPTION OF RELATED ART

The application of organic light emitting devices has become more and more popular in the fields of displays, lightings, and the like. For reducing the cost on manufacturing methods, production equipment, and development of related materials, an inkjet printing (IJP) technique has been introduced to manufacture organic light emitting devices. Though the manufacturing cost of the IJP technique is lower, a light emitting structure manufactured by the IJP technique has an issue of uneven film thickness, which leads the organic light emitting device to fail to have an even light emitting effect.

SUMMARY OF INVENTION

The invention provides a light emitting device which has an even light emitting effect.

The invention provides a light emitting device which provides flexibility in material selection.

A light emitting device in accordance with embodiments of the invention includes a base, a first electrode, a barrier structure layer, a light emitting structure layer, and a second electrode. The first electrode is disposed on the base. The barrier structure layer is disposed on the base. In addition, the barrier structure layer surrounds the periphery of the first electrode. The barrier structure layer includes a first barrier layer, a second barrier layer and a third barrier layer. The first barrier layer is disposed on the base and is in contact with the first electrode. The second barrier layer stacks on the first barrier layer. The third barrier layer stacks on the second barrier layer. The materials of the first barrier layer and the third barrier layer include a dielectric material. The material of the second barrier layer includes a metal material. A boundary between the third barrier layer and the second barrier layer keeps a vertical distance from the first electrode. The light emitting structure layer is disposed on the first electrode and surrounded by the barrier structure layer. The thickness of the light emitting structure layer is not greater than the vertical distance. The second electrode is disposed on the base, and the light emitting structure layer is disposed between the first electrode and the second electrode.

In an embodiment of the invention, the thickness of the aforementioned light emitting structure layer includes a first thickness at a central area of the light emitting structure layer and a second thickness of an edge of the light emitting structure layer, and the first thickness is smaller than the second thickness.

In an embodiment of the invention, the aforementioned first thickness is from 1000 Å to 2500 Å.

In an embodiment of the invention, the aforementioned second thickness is from 4500 Å to 6500 Å.

In an embodiment of the invention, materials of the aforementioned third barrier layer include a fluorine-containing photoresist material.

In an embodiment of the invention, materials of the aforementioned first barrier layer include an organic dielectric material or an inorganic dielectric material.

In an embodiment of the invention, a water contact angle of the aforementioned first barrier layer is smaller than a water contact angle of the third barrier layer.

In an embodiment of the invention, the aforementioned third barrier layer has a contact hole, and the second electrode electrically contacts the second barrier layer through the contact hole.

In an embodiment of the invention, the aforementioned second barrier layer includes an inner barrier pattern and an outer barrier pattern. The inner barrier pattern keeps a gap from the outer barrier pattern. The inner barrier pattern is disposed between the light emitting structure layer and the outer barrier pattern. In addition, the first barrier layer has a contact hole, whereas the outer barrier pattern electrically contacts the first electrode through the contact hole.

In an embodiment of the invention, the aforementioned first barrier layer has a first bottom edge surrounding a first bottom opening. The second barrier layer has a second bottom edge surrounding a second bottom opening. The third barrier layer has a third bottom edge surrounding a third bottom opening. The second bottom opening is greater than the first bottom opening, and the third bottom opening is greater than the second bottom opening.

In an embodiment of the invention, the aforementioned first barrier layer has a first top edge, and the first top edge keeps a lateral distance from the second bottom edge.

In an embodiment of the invention, the aforementioned second dielectric barrier layer has a second top edge, and the second top edge keeps a lateral distance from the third bottom edge.

In an embodiment of the invention, a sidewall of the aforementioned second barrier layer is retracted relative to a sidewall of the third barrier layer, and an undercut structure is formed between the sidewall of the second barrier layer and the sidewall of the third barrier layer.

A light emitting device in accordance with embodiments of the invention includes a base, a first electrode, a barrier structure layer, a light emitting structure layer, and a second electrode. The first electrode is disposed on the base. The barrier structure layer is disposed on the base, and the barrier structure layer surrounds the periphery of the first electrode. The barrier structure layer includes a first barrier layer, a second barrier layer, and a third barrier layer. The first barrier layer is disposed on the base and is in contact with the first electrode. The second barrier layer stacks on the first barrier layer. The third barrier layer stacks on the second barrier layer. The first barrier layer has a first bottom edge surrounding a first bottom opening. The second barrier layer has a second bottom edge surrounding a second bottom opening. The third barrier layer has a third bottom edge surrounding a third bottom opening. The second bottom opening is greater than the first bottom opening, and the third bottom opening is greater than the second bottom opening. A boundary between the third barrier layer and the second barrier layer keeps a vertical distance from the first electrode. A light emitting structure layer is disposed on the first electrode, and surrounded by the barrier structure layer.

The thickness of the light emitting structure layer is not greater than the vertical distance. The second electrode is disposed on the base, and the light emitting structure layer is disposed between the first electrode and the second electrode.

In an embodiment of the invention, the material of the aforementioned first barrier layer is an inorganic dielectric material or an organic dielectric material.

In an embodiment of the invention, the material of the aforementioned first barrier layer is silicon oxide and the material of the second barrier layer is silicon nitride.

In an embodiment of the invention, the material of the aforementioned second barrier layer is an inorganic dielectric material or a metal material.

In an embodiment of the invention, a water contact angle of the aforementioned first barrier layer is smaller than a water contact angle of the third barrier layer.

Based on the above, a multi-layers structure of the barrier structure layer is adopted in the light emitting device of the embodiment of the invention. The material of a middle barrier layer among the layers of the barrier structure layer is a metal or an inorganic dielectric material. As such, the light-emitting structural layer manufactured with the barrier structure layer of the embodiment of the invention has a desired thickness. In addition, the metal or inorganic intermediate barrier layer in the barrier structure layer also helps block the escape gas of other organic layers from invading the light-emitting structure layer, thereby helping ensure the quality of the light-emitting element.

In order to make the aforementioned and other features and advantages of the invention comprehensible, several exemplary embodiments accompanied with figures are described in detail below.

DESCRIPTION OF EMBODIMENTS

Figure 1:
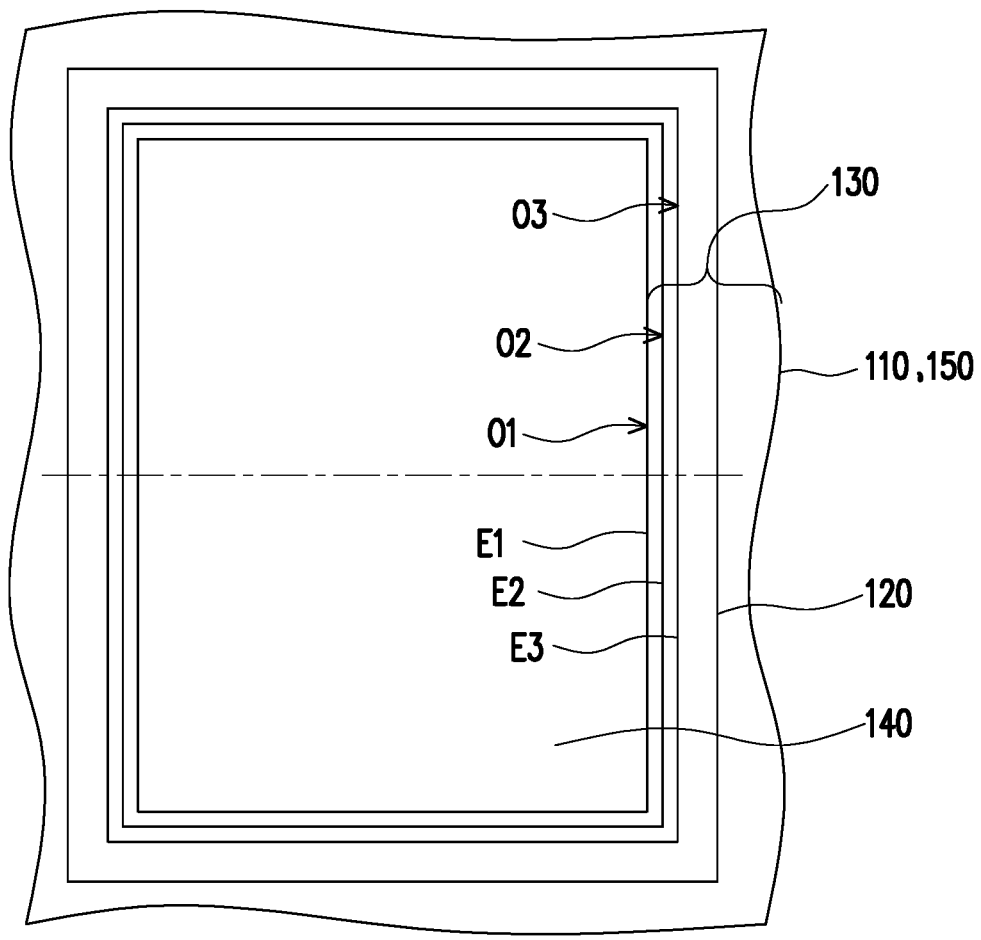
FIG. 1 is a schematic top view of a light emitting device of an embodiment of the invention.
Figure 2:
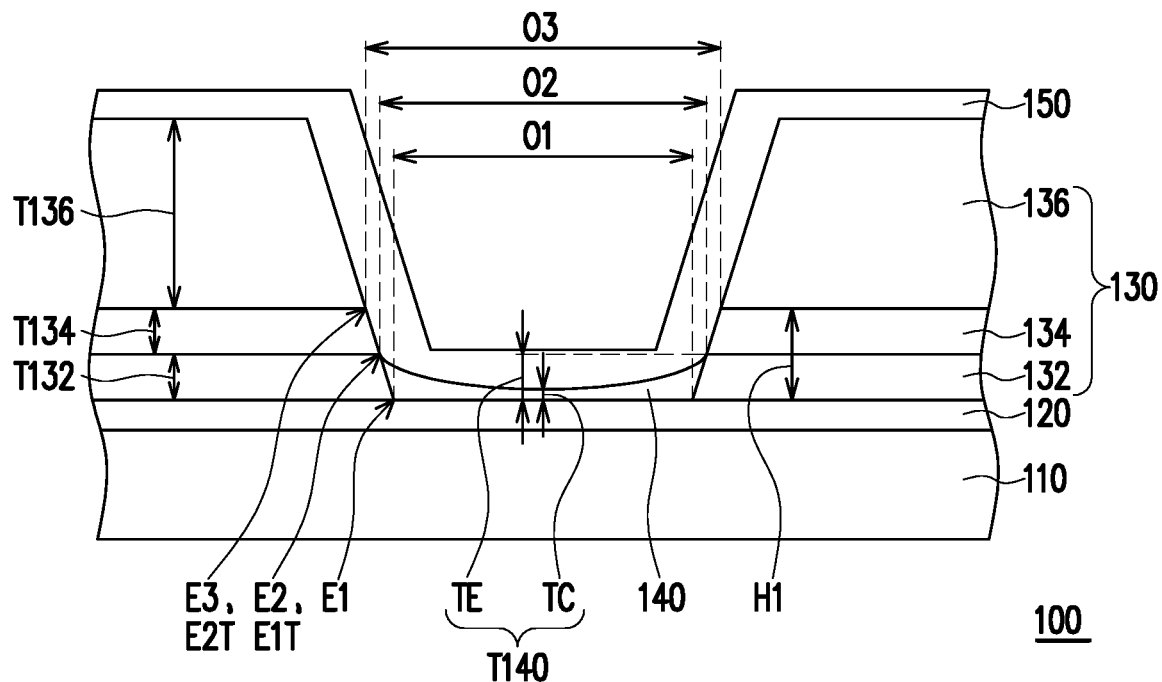
FIG. 2 is a schematic view showing a cross-section of a light emitting device of FIG. 1 along a section line I-I.

FIG. 1 is a schematic top view of a light emitting device of an embodiment of the invention, and FIG. 2 is a schematic cross-sectional view of a light emitting device of FIG. 1 along a section line I-I. Please refer to FIG. 1 and FIG. 2. A light emitting device 100 includes a base 110, a first electrode 120, a barrier structure layer 130, a light emitting structure layer 140, and a second electrode 150. The first electrode 120 and the barrier structure layer 130 are both disposed on the base 110. In addition, the light emitting structure layer 140 is disposed on the first electrode 120, and surrounded by the barrier structure layer 130. The second electrode 150 is disposed on the base 110 in a way that the light emitting structure layer 140 is disposed between the first electrode 120 and the second electrode 150.

In this embodiment, the base 110 may be an active device array substrate. However, it may also be a wiring substrate not having an active device array. As far as the active device array substrate is concerned, the base 110 may include a substrate and an active device structure disposed on the substrate. For example, the active device structure may include a thin-film transistor, a capacitor, and components alike, and may further include signal lines. As far as the wiring substrate is concerned, the base 110 may include a substrate and signal lines disposed on the substrate. Whether it is an active device array substrate or a wiring substrate, the base 100 may provide a signal delivery path to pass the required signals to the first electrode 120 and the second electrode 150, such that the light emitting structure layer 140, disposed between the first electrode 120 and the second electrode 150, emits light driven by an electric signal.

It can be acquired from FIG. 1 that the first electrode 120 is a patterned electrode layer, and the barrier structure layer 130 surrounds the periphery of the first electrode 120. In some embodiments, the whole light emitting device 100 may include a plurality of the first electrodes 120 and the first electrodes 120 are arranged in an array. At the same time, the barrier structure layer 130 may be distributed along the spacing areas between adjacent first electrodes 120 on the whole light emitting device 100, and a grid-like pattern may thus be defined. In addition, the light emitting structure layer 140 may be formed in an opening of the grid defined by the barrier structure layer 130. FIG. 1 illustrates one first electrode 120 and one corresponding grid as an illustration. However, the whole light emitting device 100 may be understood as having a plurality of the structures presented in FIG. 1 arranged in an array. The first electrode 120 may be manufactured by a single conductive material layer or a multiple conductive material layers. The conductive materials may include one or more selected from a conductive oxide, an organic conductive material, a metal, and so on. In some embodiments, the first electrode 120 may include a stack of an indium tin oxide layer-silver layer-indium tin oxide layer. However, the invention is not limited thereto.

It can be acquired from FIG. 1 and FIG. 2 that the barrier structure layer 130 is a structure stacked by a plurality of film layers in the embodiment. Specifically, the barrier structure layer 130 may include a first barrier layer 132, a second barrier layer 134, and a third barrier layer 136. The first barrier layer 132 is disposed on the base 110 and is in contact with the first electrode 120. The second barrier layer 134 stacks on the first barrier layer 132, whereas the third barrier layer 136 stacks on the second barrier layer 134.

In this embodiment, the first barrier layer 132 has a first bottom edge E1 surrounding a first bottom opening O1. The second barrier layer 134 has a second bottom edge E2 surrounding a second bottom opening O2. The third barrier layer 136 has a third bottom edge E3 surrounding a third bottom opening O3. The second bottom opening O2 is greater than the first bottom opening O1, and the third bottom opening O3 is greater than the second bottom opening O2. Furthermore, it can be acquired from FIG. 2 that the first barrier layer 132, the second barrier layer 134 and the third barrier layer 136 all have, for example, tilted sidewalls. Therefore, a groove structure with a small bottom area and a large top area may be defined by the barrier structure layer 130.

In some embodiments, a first top edge E1T of the first barrier layer 132 may be selectively aligned with the second bottom edge E2 of the second barrier layer 134, whereas a second top edge E2T of the second barrier layer 134 is selectively aligned with the third bottom edge E3 of the third barrier layer 136. Therefore, the sidewalls of the first barrier layer 132, the second barrier layer 134, and the third barrier layer 136 may together form a continuously bend-free or smooth inclined surface. However, the invention is not limited thereto. In some embodiments, the first top edge E1T of the first barrier layer 132 selectively keeps a lateral distance from the second bottom edge E2 of the second barrier layer 134, and/or the second top edge E2T of the second barrier layer 134 selectively keeps a lateral distance from the third bottom edge E3 of the third barrier layer 136. Here, the aforementioned top edge and the bottom edge respectively indicate an outline of the top surface away from the base 110 and an outline of the bottom surface close to the base 110 in a single film layer.

In some embodiments, the material of the first barrier layer 132 may be an organic dielectric material. The material of the second barrier layer 132 may be a metal material. The material of the third barrier layer 136 may also be an organic dielectric material. At the same time, although both the first barrier layer 132 and the third barrier layer 136 are organic dielectric materials, the third barrier layer 136 is more hydrophobic compared to the first barrier layer 132. For example, the material of the third barrier layer 136 may include a fluorine-containing photoresist material, whereas the material of the first barrier layer 132 may be a fluorine-free photoresist material. A water contact angle of the first barrier layer 132 may be smaller than a water contact angle of the third barrier layer 136. For example, the water contact angle of the first barrier layer 132 may be smaller than 40 degrees, whereas the water contact angle of the third barrier layer 136 may be greater than 70 degrees. However, the invention is not limited thereto.

In still other embodiments, the material of the first barrier layer 132 may be an inorganic dielectric material. The material of the second barrier layer 132 may also be an inorganic dielectric material, whereas the material of the third barrier layer 136 may be an organic dielectric material. At this time, the material of the third barrier layer may include a fluorine-containing photoresist material, and the first barrier layer 132 and the second barrier layer 134 are made by using different inorganic dielectric materials. For example, the material of the first barrier layer 132 is silicon oxide, whereas the material of the second barrier layer 134 is silicon nitride. When the barrier structure layer 130 is manufactured, the second barrier layer 134 may be patterned first by dry etching, and the first barrier layer 132 may be patterned by wet etching afterwards. As such, damages of the first electrode 120 may be reduced during patterning the first barrier layer 132 and the second barrier layer 134.

Overall, the first barrier layer 132 may be an organic dielectric material or an inorganic dielectric material. The second barrier layer 134 maybe a metal material or an inorganic dielectric material, whereas the third barrier layer 136 may be an organic dielectric material. Meanwhile, the first barrier layer 132, the second barrier layer 134, and the third barrier layer 136 may be manufactured by three different materials. For instance, materials of the first barrier layer 132, the second barrier layer 134, and the third barrier layer 136 may be selected from the combination listed below: fluorine-free photoresist material/metal/fluorine-containing photoresist material, fluorine-free material/an inorganic dielectric material/fluorine-containing photoresist material, an inorganic dielectric material/metal-fluorine/containing photoresist material, or an inorganic dielectric material/an inorganic dielectric material/fluorine-containing photoresist material. However, the invention is not limited thereto.

The light emitting structure layer 140 is disposed in a groove constructed by the barrier structure layer 130 and is in contact with the first electrode 120. In this embodiment, a thickness T140 of the light emitting structure layer 140 is not greater than the total thickness of the first barrier layer 132 and the second barrier layer 134. In other words, when a boundary between the third barrier layer 136 and the second barrier layer 134 keeps a vertical distance H1 from the first electrode 120, the thickness T140 of the light emitting structure layer 140 is not greater than the vertical distance H1.

In FIG. 2, although the light emitting structure layer 140 is illustrated as a single layer, it is not limited thereto. For example, the light emitting structure layer 140 may include a hole injection layer, a hole transport layer, and a light emitting layer. In the manufacturing process of the light emitting device 100, after the barrier structure layer 130 is formed on the base 110, an inkjet printing (IJP) technique may be adopted to print desired material droplets into the groove defined by the barrier structure layer 130 to form at least one layer of the hole injection layer, the hole transport layer, and the light emitting layer. Here, the material droplets forming the hole injection layer, the hole transport layer, and the light emitting layer may be a solution of an organic material. That is, the light emitting structure layer 140 is a light emitting structure layer of the organic materials.

The third barrier layer 136 in the barrier structure layer 130 has better hydrophobicity compared to the first barrier layer 132 and the second barrier layer 134. Therefore, the material droplets may be limited within the groove defined by the barrier structure layer 130 without spilling out. Moreover, the material droplets may be hardly or not in contact with the third barrier layer 136. Besides, the first barrier layer 132 may have better hydrophobicity compared to the second barrier layer 134, which makes the material droplets continuously attached and in contact with the surface of the first electrode 120 as well as the sidewall of the first barrier layer 132. Afterwards, a drying step may be further proceeded, and the material droplets are dried and form at least one of the light emitting structure layer 140.

According to the aforementioned steps, the light emitting structure layer 140 has the thickness T140, which is thinner in the center and thicker at the edge. In other words, the thickness T140 of the light emitting structure layer 140 includes a first thickness TC at a central area of the light emitting structure layer 140, and a second thickness TE at an edge of the light emitting structure layer 140. In addition, the first thickness of TC is smaller than the second thickness of TE. In some embodiments, the first thickness TC is, for example, from 1000 Å to 2500 Å, whereas the second thickness TE is, for example, from 4500 Å to 6500 Å.

Since the first barrier layer 132 has relatively good hydrophilicity, the affinity of the material droplets to the first barrier layer 132 may be superior to the affinity of the material droplets to the second barrier layer 134. As such, a thickness T132 of the first barrier layer 132 may limit the distribution of material droplets and affect the thickness T140 of the light-emitting structure layer 140. For example, the greater the thickness T132 of the first barrier layer 132 is, the higher the material droplets attached to part of the first barrier layer 132 (farther from the base 110) may be extended. This may result in a significant increase in the second thickness TE of the resulting light-emitting structure layer 140 after the material droplets are dried, leading to a significantly uneven film thickness of the light-emitting structure layer 140. Therefore, the thickness T132 of the first barrier layer 132 may be selectively restrict to a range from 2000 Å to 1 µm, and may also be restrict to a range from 2000 Å to 5000 Å, or a range from 5000 Å to 1 µm.

Furthermore, the second barrier layer 134 is disposed between the first barrier layer 132 and the third barrier layer 136 having greater difference in hydrophobicity than the first barrier layer 132. If the thickness T134 of the second barrier layer 134 is thick, the third barrier layer 136 may fail to effectively limit the distribution of material droplets despite having hydrophobic properties. Thus, the thickness T134 of the second barrier layer 134 may be selectively from 500 Å to 5000 Å, or be selectively from 1500 Å to 2000 Å. The thickness T136 of the third barrier layer 136 may be from 1.5 µm to 2 µm. As such, the barrier structure layer 130 may have enough thickness to prevent light emitting material droplets from being mixed or overflowing into other areas during the manufacturing process.

The second electrode 150 may cover most of the area of base 110 in the light emitting device 100. Therefore, in FIG. 1, both the base 110 and the second electrode 150 are indicated on the edge of the entire component. Specifically, the second electrode 150 continuously extends from the top surface of the barrier structure layer 130 to the sidewall of the barrier structure layer 130 and covers the top surface of the light emitting structure layer 140. In the light emitting device 100, the second electrode 150 may be a cathode, whereas the first electrode 120 may be an anode. Moreover, the light emitting structure layer 140 is disposed between the cathode and the anode to form an organic light emitting diode structure. Besides, an electron transport layer, an electron injection layer, and other film layers alike may be further disposed between the second electrode 150 and the light emitting structure layer 140, such that the organic light emitting diode structure has desirable light emitting efficiency. In some embodiments, the electron transport layer, the electron injection layer and the second electrode 150 may be formed by deposition, such as evaporation, sputtering, or the like. However, in other embodiments, the second electrode 150 may be manufactured by deposition, while the electron transport layer and the electron injection layer may be selectively manufactured by inkjet printing.

In this embodiment, the light emitting device 100 has a multi-layers barrier structure layer 130. In some embodiments, the third barrier layer 136 is manufactured by an organic dielectric material, for example, a photoresist material which may produce escape gases. However, the second barrier layer 134 of the barrier structure layer 130 is manufactured by a metal material or an inorganic dielectric material. Hence, the second barrier layer 134 may be disposed to block escape gases from the third barrier layer 136, and prevent the light emitting structure layer 140 from being deteriorated by the escape gases of the third barrier layer 136. When the first barrier layer 132 is an inorganic dielectric material, it is also helpful for preventing the escape gases of the third barrier layer 136 from invading the light emitting structure layer 140. Also, when the second barrier layer 134 is a metal material, the second electrode 150 is in contact with the sidewall of the second barrier layer 134, and the conductivity of the second electrode 150 may be enhanced. In other words, the configuration of the second barrier layer 134 may enhance the quality of the light emitting device 100.

Figure 3:
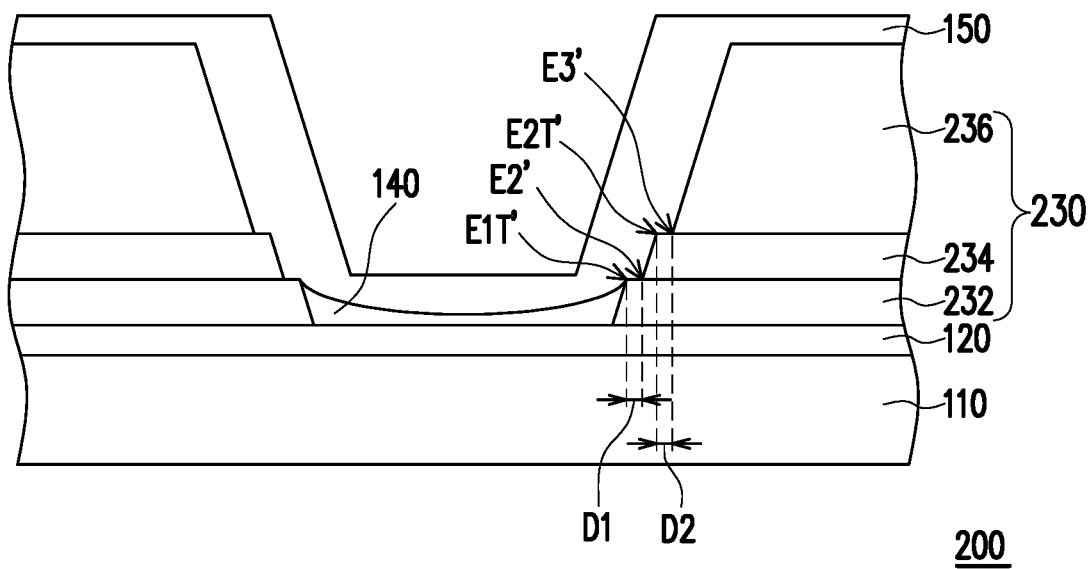
FIG. 3 is a schematic view showing a partial cross-section of a light emitting device of another embodiment of the invention.

FIG. 3 is a partial schematic view of a light emitting device of another embodiment of the invention. In FIG. 3, a light emitting device 200 includes the base 110, the first electrode 120, a barrier structure layer 230, the light emitting structure layer 140, and the second electrode 150, where the base 110, the first electrode 120, the light emitting structure layer 140, and the second electrode 150 are generally similar to those in the embodiments of FIG. 2, which are not repeated herein. The difference between the present embodiment and the embodiments of FIG. 2 is the design of the barrier structure layer 230. Specifically, the barrier structure layer 230 is similar to the aforementioned barrier structure layer 130, which has a three-layers structure, and includes a first barrier layer 232, a second barrier layer 234, and a third barrier layer 236. However, sidewalls of the first barrier layer 232, the second barrier layer 234, and the third barrier layer 236 are not connected to a continuously bend-free or smooth inclined surface.

In this embodiment, a first top edge E1T' of the first barrier layer 232 may selectively keep a lateral distance D1 from the second bottom edge E2' of the second barrier layer 234, where the lateral distance D1 may be from 0.1 µm to 0.25 µm. Furthermore, a second top edge E2T' of the second barrier layer 234 may selectively keep a lateral distance D2 from a third bottom edge E3' of the third barrier layer 236, where the lateral distance D2 may be from 0.1 µm to 0.25 µm. In other words, the first barrier layer 232, the second barrier layer 234, and the third barrier layer 236 consist of a stepped sidewall structure. In addition, the farther the first barrier layer 232, the second barrier layer 234, and the third barrier layer 236 are away from the base 110, the smaller the width they are.

Figure 4:
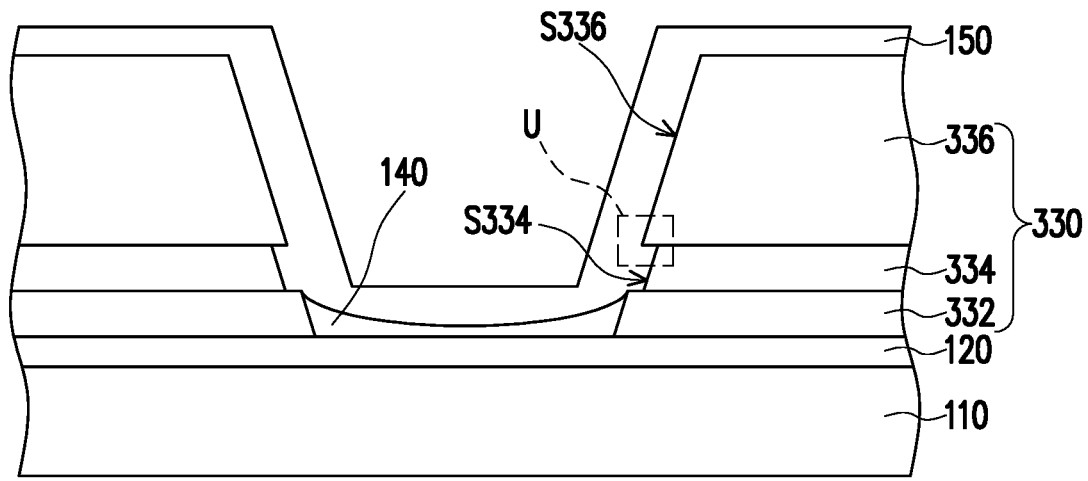
FIG. 4 is a schematic view showing a partial cross-section of a light emitting device of yet another embodiment of the invention.

FIG. 4 is a partial schematic view of a light emitting device of yet another embodiment of the invention. In FIG. 4, a light emitting device 300 includes the base 110, the first electrode 120, a barrier structure layer 330, the light emitting structure layer 140, and the second electrode 150, where the base 110, the first electrode 120, the light emitting structure layer 140, and the second electrode 150 are generally similar to those in the embodiments of FIG. 2, which shall not be repeated herein. The difference between the present embodiment and the embodiments of FIG. 2 is the design of the barrier structure layer 330. Specifically, the barrier structure layer 330 is similar to the aforementioned barrier structure layer 130, which has a three-layers structure, and includes a first barrier layer 332, a second barrier layer 334, and a third barrier layer 336. However, sidewalls of the first barrier layer 332, the second barrier layer 334, and the third barrier layer 336 are not connected to a continuously bend-free or smooth inclined surface.

In this embodiment, a sidewall S334 of the aforementioned second barrier layer 334 is retracted relative to a sidewall S336 of the third barrier layer 336, and an undercut structure U is formed between the sidewall S334 of the second barrier layer 334 and the sidewall S336 of the third barrier layer 336. For example, in some embodiments, the third barrier layer 336 may be manufactured by photoresist materials. Meanwhile, when the barrier structure layer 330 is manufactured, the third barrier layer 336 that has been patterned by the yellow light process may be applied as a mask for patterning the second barrier layer 334 and the first barrier layer 332 below. Specifically, the third isolation layer 336 is first applied as a mask, such that the second isolation layer 334 may be patterned by dry etching. The first barrier layer 332 may be patterned by wet etching afterwards by applying the third barrier layer 336 as a mask. As such, the second barrier layer 334 may be retracted relative to the third barrier layer 336. However, in other embodiments, the retracted structure of the second barrier layer 334 may not be limited by the aforementioned manufacturing methods.

Figure 5:
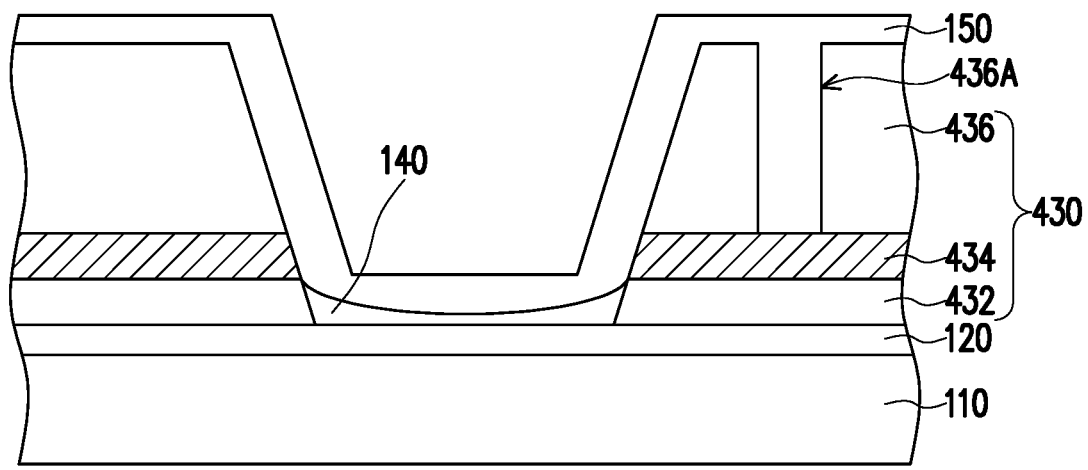
FIG. 5 is a schematic view showing a partial cross-section of a light emitting device of still another embodiment of the invention.

FIG. 5 is a partial schematic view of a light emitting device of still another embodiment of the invention. In FIG. 5, a light emitting device 400 includes the base 110, the first electrode 120, a barrier structure layer 430, the light emitting structure layer 140, and the second electrode 150. The base 110, the first electrode 120, the light emitting structure layer 140, and the second electrode 150 are generally similar to those in the embodiments of FIG. 2, which shall not be repeated herein. The difference between the present embodiment and the embodiments of FIG. 2 is the design of the barrier structure layer 430. Specifically, the barrier structure layer 430 is similar to the aforementioned barrier structure layer 130, which has a three-layers structure, and includes a first barrier layer 432, a second barrier layer 434, and a third barrier layer 436. The materials, structure, and configuration of the first barrier layer 432 are the same as those of the first barrier layer 132 of FIG. 2. The second barrier layer 434 in this embodiment is a metal material, and the third barrier layer 436 has a contact hole 436A. In this embodiment, the second electrode 150 may fill in the contact hole 436A, and electrically contact with the second barrier layer 434 of the metal material via the contact hole 436A. As such, the conductivity of the second electrode 150 may be enhanced.

Figure 6:
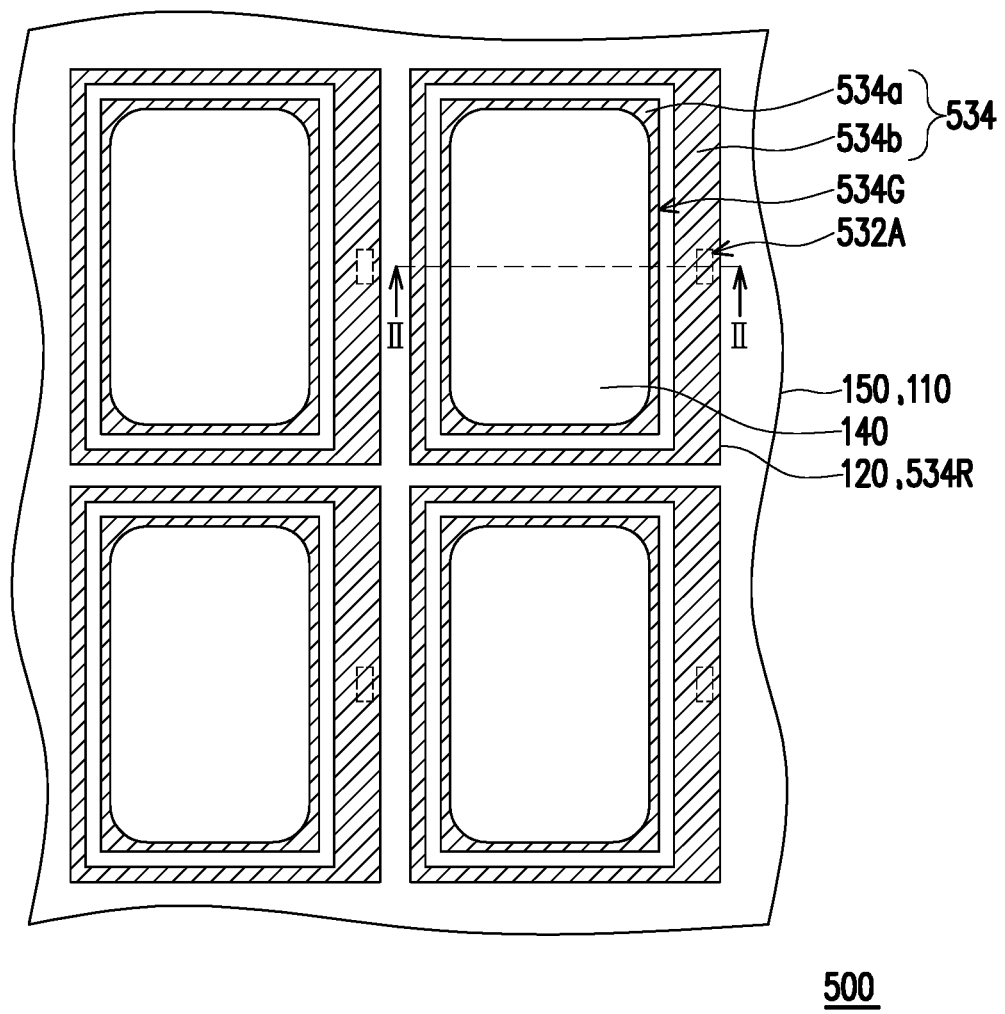
FIG. 6 is a schematic top view of a light emitting device of still further embodiment of the invention.
Figure 7:
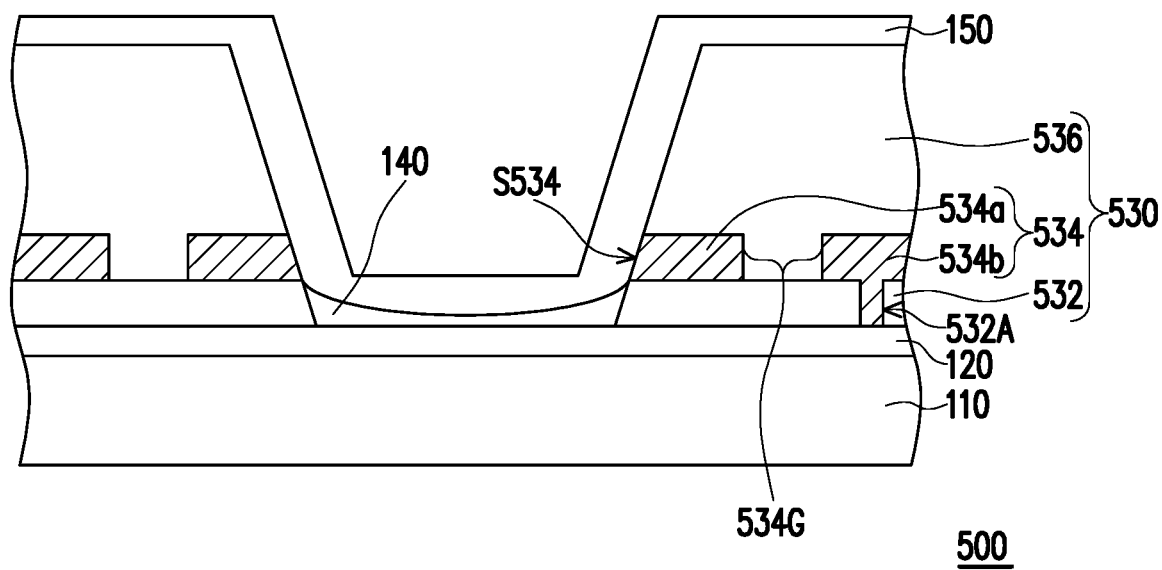
FIG. 7 is a schematic view showing a cross-section of a light emitting device of FIG. 6 along a section line II-II.

FIG. 6 is a schematic top view of a light emitting device of still further embodiment of the invention, and FIG. 7 is a schematic view of a light emitting device of FIG. 6 along a section line II-II. In FIG. 6 and FIG. 7, a light emitting device 500 includes the base 110, the first electrode 120, a barrier structure layer 530, the light emitting structure layer 140, and the second electrode 150. The base 110, the first electrode 120, the light emitting structure layer 140 and second electrode 150 are generally similar to those in the embodiments of FIG. 2, which shall not be repeated herein. The difference between the present embodiment and the embodiments of FIG. 2 is the design of the barrier structure layer 530. In this embodiment, the barrier structure layer 530 has a three-layers structure, and includes a first barrier layer 532, a second barrier layer 534, and a third barrier layer 536. The first barrier layer 532 is disposed on the base 110, and is in contact with the first electrode 120. The second barrier layer 534 stacks on the first barrier layer 532, and the third barrier layer 536 stacks on the second barrier layer 534.

Specifically, the second barrier layer 534 is, for example, a metal material, and includes an inner barrier pattern 534a and an outer barrier pattern 534b. The inner barrier pattern 534a keeps a gap 534G from the outer barrier pattern 534b, and the inner barrier pattern 534a is disposed between the light emitting structure layer 140 and the outer barrier pattern 534b. It may be acquired from FIG. 6 that the inner barrier pattern 534a surrounds the light emitting structure layer 140. The gap 534G surrounds the inner barrier pattern 534a, while the outer barrier pattern 534b surrounds the gap 534G. Moreover, in some embodiments, an outline of the outer barrier pattern 534b away from the light emitting structure layer 140 may substantially correspond to the outline of the first electrode 120. Accordingly, although the barrier structure layer 530 may define a plurality of grids, the second barrier layer 534 is patterned into a plurality of independent frame-like patterns instead of continuously extending between the different first electrodes 120. The third barrier layer 536 fills in the gap 534G between the inner barrier pattern 534a and the adjacent outer barrier pattern 534b.

In this embodiment, the inner barrier pattern 534a and the outer barrier pattern 534b of the second barrier layer 534 are independent from each other without physical contact. The sidewall S534 of the inner barrier pattern 534a surrounding the light emitting structure layer 140 is covered by the second electrode 150 to electrically contact the second electrode 150. Furthermore, the first barrier layer 532 may have a contact hole 532A, such that the outer barrier pattern 534b electrically contacts the first electrode 120 through the contact hole 532A. Hence, the inner barrier pattern 534a and the outer barrier pattern 534b may be respectively electrically in contact with the second electrode 150 and the first electrode 120. As such, apart from successfully reducing the resistance of the second electrode 150, the second barrier layer 534 also helps to reduce the resistance of the first electrode 120, so as to enhance the quality of the light emitting device 500.

In view of the above, the light emitting device of the embodiment of the invention is adopted a barrier structure layer having a multilayer structure, for example, the first barrier layer, the second barrier layer, and the third barrier layer stacked in sequence. The second barrier layer disposed in the middle is selectively adopted as a metal material or an inorganic dielectric material. Compared to the first barrier layer and the second barrier, the third barrier layer is more hydrophobic. As such, the barrier structure layer of the embodiment of the invention effectively limits the distribution of material droplets in the inkjet printing process, so a desired light emitting structure layer is manufactured. Furthermore, when the first barrier layer is manufactured by an organic material, the escape gas from the first barrier layer may be blocked by the second barrier layer without invading the light emitting structure layer.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. A light emitting device, comprising:
 a base;
 a first electrode, disposed on the base;
 a barrier structure layer, disposed on the base, and the barrier structure layer surrounding a periphery of the first electrode, wherein the barrier structure layer comprises:
  a first barrier layer, disposed on the base and in contact with the first electrode;
  a second barrier layer, stacking on the first barrier layer; and
  a third barrier layer, stacking on the second barrier layer, wherein materials of the first barrier layer and the third barrier layer include a dielectric material, a material of the second barrier layer includes a metal material, and a boundary between the third barrier layer and the second barrier layer keeps a vertical distance from the first electrode;
 a light emitting structure layer, disposed on the first electrode, surrounded by the barrier structure layer, and a thickness of the light emitting structure layer not greater than the vertical distance; and
 a second electrode, disposed on the base, and the light emitting structure layer being disposed between the first electrode and the second electrode, wherein the second barrier layer is a conductive metal layer electrically connected with the second electrode.

2. The light emitting device as claimed in claim 1, wherein the thickness of the light emitting structure layer comprises a first thickness at a central area of the light emitting structure layer and a second thickness at an edge of the light emitting structure layer, and the first thickness is smaller than the second thickness.

3. The light emitting device as claimed in claim 2, wherein the first thickness is from 1000 Å to 2500 Å.

4. The light emitting device as claimed in claim 2, wherein the second thickness is from 4500 Å to 6500 Å.

5. The light emitting device as claimed in claim 1, wherein a thickness of the first barrier layer is from 2000 Å to 1 μm.

6. The light emitting device as claimed in claim 1, wherein the material of the third barrier layer comprises a fluorine-containing photoresist material.

7. The light emitting device as claimed in claim 1, wherein the material of the first barrier layer comprises an organic dielectric material or an inorganic dielectric material.

8. The light emitting device as claimed in claim 1, wherein a water contact angle of the first barrier layer is smaller than a water contact angle of the third barrier layer.

9. The light emitting device as claimed in claim 1, wherein the third barrier layer has a contact hole, and the second electrode electrically contacts the second barrier layer through the contact hole.

10. The light emitting device as claimed in claim 1, wherein the second barrier layer comprises an inner barrier pattern and an outer barrier pattern, the inner barrier pattern keeps a gap from the outer barrier pattern, the inner barrier pattern is disposed between the light emitting structure layer and the outer barrier pattern, and the first barrier layer has a contact hole, whereas the outer barrier pattern electrically contacts the first electrode through the contact hole.

11. The light emitting device as claimed in claim 1, wherein the first barrier layer has a first bottom edge surrounding a first bottom opening, the second barrier layer has a second bottom edge surrounding a second bottom opening, and the third barrier layer has a third bottom edge surrounding a third bottom opening, the second bottom opening is greater than the first bottom opening, and the third bottom opening is greater than the second bottom opening.

12. The light emitting device as claimed in claim 11, wherein the first barrier layer has a first top edge, and the first top edge keeps a lateral distance from the second bottom edge.

13. The light emitting device as claimed in claim 11, wherein the second barrier layer has a second top edge, and the second top edge keeps a lateral distance from the third bottom edge.

14. The light emitting device as claimed in claim 1, wherein a sidewall of the second barrier layer is retracted relative to a sidewall of the third barrier layer, and an undercut structure is formed between the sidewall of the second barrier layer and the sidewall of the third barrier layer.

15. A light emitting device, comprising:
a base;
a first electrode, disposed on the base;
a barrier structure layer, disposed on the base, and the barrier structure layer surrounding a periphery of the first electrode, wherein the barrier structure layer comprises:
a first barrier layer, disposed on the base and in contact with the first electrode;
a second barrier layer, stacking on the first barrier layer; and
a third barrier layer, stacking on the second barrier layer, wherein materials of the first barrier layer and the third barrier layer include a dielectric material, a material of the second barrier layer includes a metal material, and a boundary between the third barrier layer and the second barrier layer keeps a vertical distance from the first electrode;
a light emitting structure layer, disposed on the first electrode, surrounded by the barrier structure layer, and a thickness of the light emitting structure layer not greater than the vertical distance; and
a second electrode, disposed on the base, and the light emitting structure layer being disposed between the first electrode and the second electrode, wherein the second barrier layer is a conductive metal layer, and the second electrode is directly in contact with a top surface of the second barrier layer and a sidewall of the second barrier layer.

16. The light emitting device as claimed in claim 15, wherein the material of the third barrier layer comprises a fluorine-containing photoresist material.

17. The light emitting device as claimed in claim 15, wherein the material of the first barrier layer comprises an inorganic dielectric material or an organic dielectric material.

18. The light emitting device as claimed in claim 15, wherein a water contact angle of the first barrier layer is smaller than a water contact angle of the third barrier layer.

* * * * *